(12) United States Patent
Martini et al.

(10) Patent No.: US 7,039,837 B2
(45) Date of Patent: May 2, 2006

(54) SIGNAL CODING

(75) Inventors: Maria Giuseppina Martini, Perugia (IT); Marco Chiani, Rinimi (IT)

(73) Assignee: Koninklijke Philips Electronics N.V., Eindhoven (NL)

( * ) Notice: Subject to any disclaimer, the term of this patent is extended or adjusted under 35 U.S.C. 154(b) by 483 days.

(21) Appl. No.: 10/201,368

(22) Filed: Jul. 23, 2002

(65) Prior Publication Data
US 2003/0034911 A1   Feb. 20, 2003

(30) Foreign Application Priority Data
Jul. 27, 2001   (EP) .................................. 01202877

(51) Int. Cl.
*G06F 11/00* (2006.01)
(52) U.S. Cl. .......................... 714/52; 714/48; 714/710; 375/240.27; 375/243
(58) Field of Classification Search .................. 714/52, 714/48, 701; 375/240.27, 243
See application file for complete search history.

(56) References Cited

U.S. PATENT DOCUMENTS

| | | | | |
|---|---|---|---|---|
| 4,755,993 A | * | 7/1988 | Grover | ........................ 370/505 |
| 5,671,156 A | * | 9/1997 | Weerackody et al. | .......... 714/52 |
| 5,706,396 A | * | 1/1998 | Schroder et al. | ............. 704/228 |
| 5,768,533 A | * | 6/1998 | Ran | ............................ 709/247 |
| 5,991,912 A | | 11/1999 | Mao | ............................ 714/776 |
| 6,202,188 B1 | * | 3/2001 | Suzuki et al. | ................. 714/758 |
| 6,522,665 B1 | * | 2/2003 | Suzuki et al. | ................. 370/471 |
| 6,754,277 B1 | * | 6/2004 | Heinzelman et al. | ... 375/240.27 |
| 2001/0005385 A1 | * | 6/2001 | Ichiguchi et al. | ............ 370/535 |
| 2002/0003840 A1 | * | 1/2002 | Ueda et al. | ............. 375/240.27 |
| 2006/0013321 A1 | * | 1/2006 | Sekiguchi et al. | ...... 375/240.27 |

FOREIGN PATENT DOCUMENTS

EP   0942569 A2   9/1999

* cited by examiner

*Primary Examiner*—Scott Baderman
*Assistant Examiner*—Paul Contino

(57) ABSTRACT

Respective error detection codes (CRC) are selectively added to respective source coded signal parts depending on the type of source coded signal part. Further, important source coded signal parts may be provided with respective error detection codes, whereas less important source coded parts are not provided with error detection codes. If the source coded signal comprises source coded packets, the error detection codes (CRC) may relate to a part of given source coded packets (p2), e.g. a header (H).

11 Claims, 7 Drawing Sheets

SIGNAL CODING

The invention relates to coding digital source signals, in particular to predictively coding such as MPEG.

The article of Raj Talluri, "Error-Resilient Video Coding in the ISO MPEG-4 Standard", *IEEE Communications Magazine,* June 1998 discloses error resilience aspects of the video coding techniques and in particular those that are standardized in the ISO MPEG-4 standard. When compressed video data is transmitted over a wireless communication channel, it is subjected to channel errors in the form of bit errors and burst errors. Typically, in order to make the video codec more resilient to channel degradations, forward error correction (FEC) codes such as Reed-Solomon codes, BCH codes and convolutional codes are employed by the encoder to protect the bit-stream before transmitting to the decoder. At the decoder, these codes are then used to correct errors in the bit-stream due to the channel noise. Typically, FEC is applied to provide a certain level of protection to the compressed bit-stream, and the residual errors are handled by the error-resilient video decoder. To handle the residual errors, the following stages are required at the video decoder: error detection and localization, resynchronization, data recovery, error concealment. FEC techniques can also be used to detect errors and pass the location of the errors to the video decoder so that the video decoder can conceal the errors. In addition to FEC, syntactic and semantic error detection techniques are also applied at the video decoder to enable the video decoder to detect when a bitstream is corrupted by channel errors. Due to the nature of the video compression algorithms, the location in the bitstream where the decoder detects an error is not the same location where the error has actually occurred but some undetermined distance away from it. Once the decoder detects an error it loses synchronization with the encoder. Resynchronization schemes are then employed for the decoder to fall back into lock step with the encoder. The specific tools adopted in the ISO MPEG-4 standard which enable the communication of compressed video data over noisy wireless channels include resynchronization strategies, data partitioning, reversible VLCs, and header extension codes.

It is an object of the invention to provide improved error detection. To this end, the invention provides coding, transmission, decoding, receiving, a signal and a storage medium as defined in the independent claims. Advantageous embodiments are defined in the dependent claims.

The invention is based on the insight that an error detection which is based on exploiting syntax errors in the received data stream may fail if the error occurred does not violate the data syntax. In that case, the source decoding process takes place, ignoring errors. Loss of synchronization may then occur. On the other hand, error handling at channel coding level does not take into account the effect of the errors on the source decoding. If an error occurs, the channel decoder may skip part of the signal, although the error could have been handled by the source decoder or just would have had a minor effect on the quality of the reproduction.

In a first embodiment, a source coded signal is furnished, and respective error detection codes are selectively added to respective source coded signal parts depending on the type of source coded signal part. By adding error detection codes to the source coded signal, an additional error detection is provided which can be used to assist syntax error detection in a source decoder.

Preferably, in a decoding, the error detection codes added to the source coded signal are evaluated. If an error has occurred, the related part of the source coded signal is replaced by a sequence with a wrong data syntax (syntax violating word), such that the source decoder is forced to detect this error and perform error concealment. The syntax violating word may be an all zeros word. Further, some fields may be adapted to syntax violating values, e.g. values that are out of range and are handled as such in a source decoder. In MPEG-4 video transmission, for the macroblock number Mb number in the packet header a zero word or an all ones word may be included. Because the error detection codes are included in an already source coded signal, and the error detection codes are deleted from the source coded signal prior to source decoding, compatibility with the given source coding standard is kept. In other words, a system is provided which is transparent to the source coding and decoding. This embodiment provides the possibility to add an error detection after source coding which takes source information into account. The source information may be known beforehand, e.g. depending on the type of source coding, or may be furnished by a source encoder. For example, important parts may be provided with an error detection code, whereas less important parts are not. Packets that need more protection than others are provided with an error check code and other packets are not. It is also possible to use longer or more error check codes for more important packets. A main characteristic is that information about the source is exploited in order to determine where to add error detection codes to the source coded signal. For some portions data assisted error detection at source decoder level suffices whereas for some other portions adding error detection codes is necessary to support data assisted error detection. If an error is detected then the partition is replaced by a syntax violating word, which is easily identifiable as being erroneous. The error concealment is left to the source decoder. In general, better error concealment is then possible compared to the case that an entire packet is replaced with zeros because an error occurred. The error, otherwise causing the packet to be replaced at channel decoding level, may be of no high importance and can be handled by error concealment in the source decoder.

In practical embodiments, only headers are provided with error detection codes, and data partitions are not. Errors that occur in data partitions are entirely handled by the source decoder. For example in the case of MPEG, if an error occurs in a data partition, only the MPEG decoder will handle this error, i.e. the MPEG source decoder will perform error concealment at Macroblock level. The consequences of a bit error in a Macroblock therefore are only handled at Macroblock level and cannot cause an entire packet be lost.

Aspects of the invention can be used as an enhancement of the source coder or of the channel coder. In practical embodiments, a standard predefined source coding is used coupled to a standard predefined channel coder. The insertion of additional error detection codes can then be construed as an intermediate layer in between the source coding and the channel coding. This solution is transparent to the standard predefined source coding and the standard predefined channel coding, which means that standard channel coding and source coding can be used. Referring to the Open Systems Interconnection (ISO) reference model, this can be seen as an intermediate layer between an application layer and a data transport layer.

In practical embodiments, the error detection codes are Cyclic Redundancy Codes (CRC). CRC codes are well known in the art of error detection. These codes are shortened cyclic codes. A CRC encoder appends p parity bits to an input binary information string in such a way that the resulting codewords correspond to polynomial multiples of a generator polynomial of degree p. The block of parity bits is computed from the information block using a linear feedback shift register (LFSR) in such a way that $$r(x)=(x^p \cdot i(x)) \bmod (g(x))$$

where $$i(x)=i_0+i_1x+\ldots+i_{k-1}x^{k-1}$$

and $$r(x)=r_0+r_1x+\ldots+r_{p-1}x^{p-1}$$

are the information and the parity bits, respectively, interpreted as polynomials, and where g(x) is the generator polynomial of the code and is implemented in the LFSR. Error detection at a receiver end is performed by computing the parity bits from the received information block and comparing these with the received parity bits. See also J. G. Proakis, *Digital Communications,* McGraw-Hill, 1995, page 386 and G. C. Clark, J. B. Cain, *Error-correction coding for Digital Communications,* Plenum, 1981, page 72.

It is noted that U.S. Pat. No. 5,991,912 discloses a communications system in which packets containing compressed digital signals are transported in multiple cells, typically in Asynchronous Transfer Mode format. Upon receipt of these cells, a determination is made as to whether cells have been lost, additional cells inserted, or whether there were bit errors in the transmission of the cells. If so, null packets are substituted for the erred packets and are sent to the video decompression layer. This prevents unwanted freezing and blocking of the video image which can occur if faulty MPEG packets are passed from the transmission system to the MPEG decoder and video display system. The MPEG packets are placed in a Convergence Sublayer Protocol Data Unit (CS-PDU) and information regarding the length of the MPEG packet or packets is stored in a trailer field in the CS-PDU. The CS-PDU is mapped into ATM cells. Besides a length check, error checking is also done on the received CS-PDU using a Cyclical Redundant Check (CRC) present in the trailer field. If the CS-PDU has been received in error, null MPEG packets are substituted for the erred packets. If an error is detected in any part of the CS-PDU, all MPEG packets (at least one) contained in the CS-PDU would be substituted with null packets, discarding a high amount of data which is not necessarily incorrect.

The aforementioned and other aspects of the invention will be apparent from and elucidated with reference to the embodiments described hereinafter.

Figure 1:
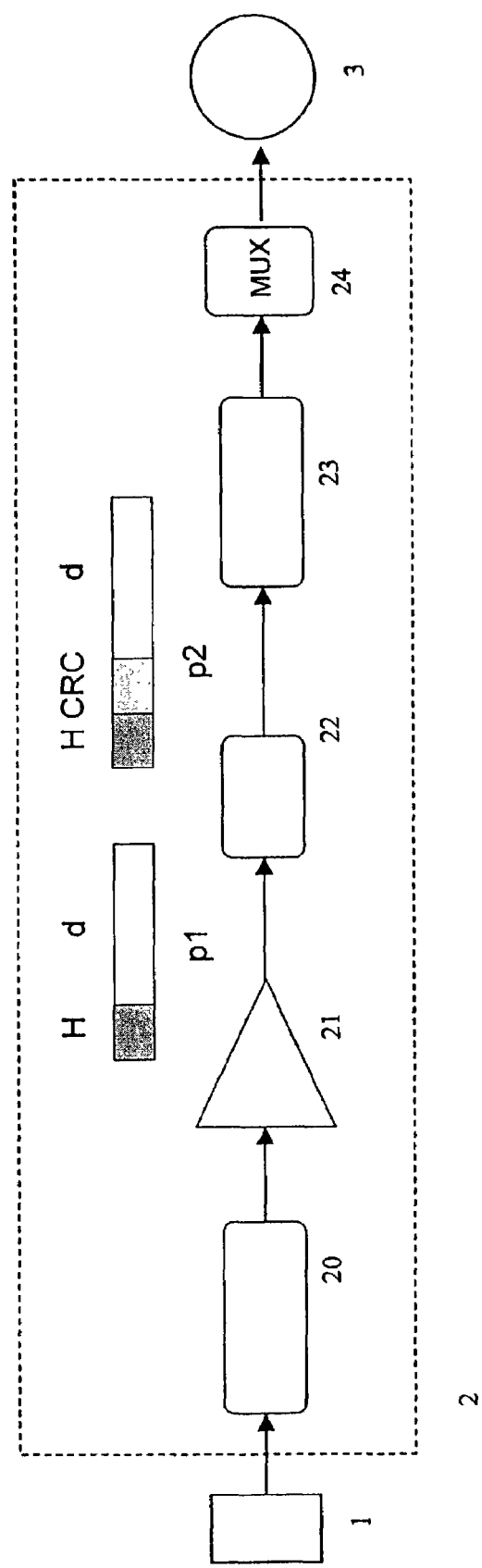
FIG. 1 shows a transmitter arrangement according to an embodiment of the invention.

FIG. 1 shows a transmitter arrangement according to an embodiment of the invention. The transmitter arrangement comprises an input unit 1 and a transmitter 2. The input unit 1 may be some network connection, (an antenna), storage medium etc. The transmitter 2 furnishes a channel coded output to a medium 3, which medium may be some network connection, an antenna, storage medium etc. The transmitter 2 comprises a source encoder 20 which furnishes a source coded signal to a packet buffer 21. A CRC insertion unit 22 adds at least one CRC code to the source coded packet obtained from the packet buffer 21. Preferably, the CRC is related to a partition requiring it (based on source information), e.g. the header H of a given source coded packet p1. In this case, the CRC may be inserted just after the header H (if the header's length is fixed or known) resulting in a packet p2. Besides the header H, the packets p1 and p2 contain data d. The source coded packet p2 comprising the CRC is furnished to a channel encoder 23 in order to obtain a channel encoded signal. The channel encoder preferably performs a forward error correction coding only. The channel encoded signal is furnished to a multiplexer 24 which makes the channel coded signal suitable for transmitting/storing to the output unit/storage medium 3. As represented in FIG. 1, CRC may be evaluated on headers' data and a CRC field associated with the header may be added to the packet. If the header's length is fixed and/or known, the CRC field may be inserted either before or after the header.

Figure 2:
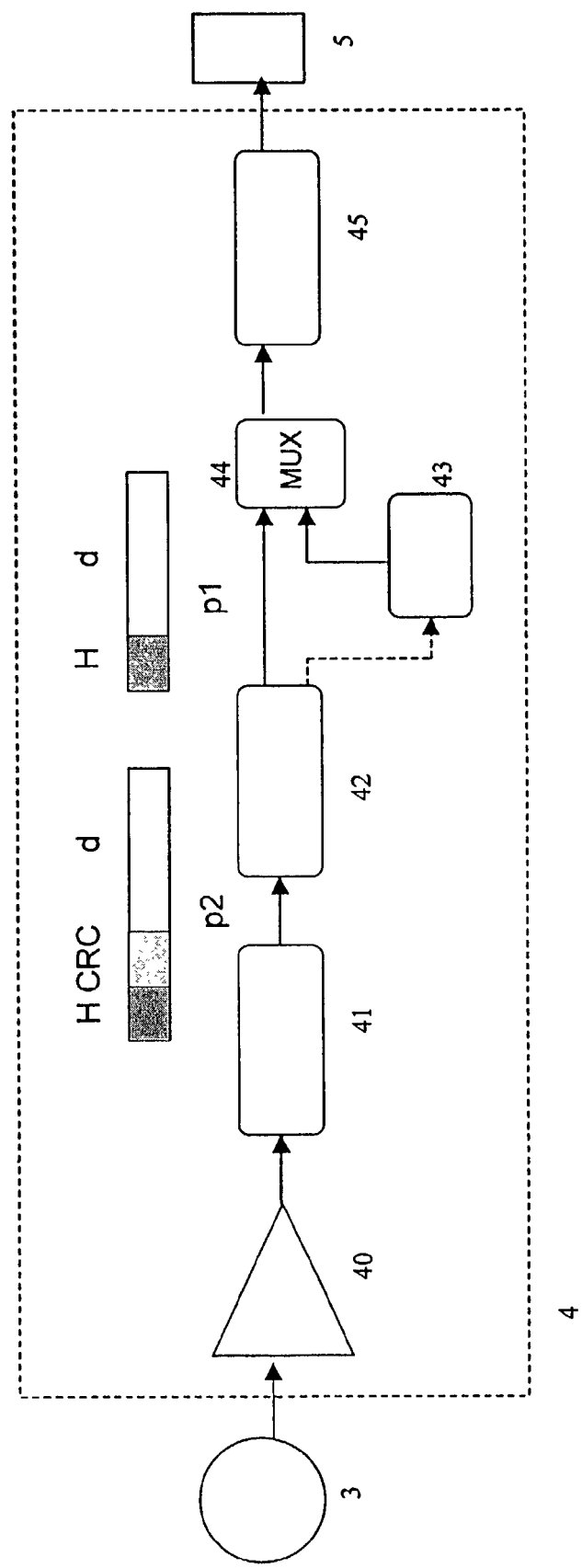
FIG. 2 shows a receiver arrangement according to an embodiment of the invention.

FIG. 2 shows a receiver arrangement according to an embodiment of the invention. The receiver arrangement comprises a receiver 4 and an output unit 5, e.g. a display. The receiver obtains from the medium 3 a channel coded signal. This channel coded signal is buffered in a packet buffer 40. Channel coded packets are furnished to the channel decoder 41 in order to obtain channel decoded packets which are similar to source coded packets but still provided with CRC codes. The CRC code is checked and deleted in CRC check unit 42. In the case the CRC check reveals that an error has occurred in the relevant portion of the bitstream, a syntax violating word is generated in a substitution unit 43. This substitution unit may comprise a look-up table which stores suitable syntax violating words. The syntax violating word is substituted to the channel-decoded packet in a multiplexer 44 preferably without changing the packet length. The channel-decoded packet is thereafter furnished to a source decoder, which uses syntax error detection and error concealment. By including the syntax violating word, the source decoder is forced to detect that an error has occurred. In particular, the whole partition or a portion of it may be substituted with incorrect data, easily recognizable as such.

A proposed technique is described below for the particular case of MPEG-4 video transmission, but it may be applied in any case data assisted error detection is not sufficient to guarantee detection and error detection need to be performed in a transparent fashion, i.e. without modifying a standard.

MPEG-4 is an ISO/IEC standard for video compression, mainly thought for content-based access for digital storage media and for digital video communication. The MPEG-4 coded bitstream is structured in Video Objects (VO), Video Object Layers (VOL), Groups of Video Object Planes (GOV), Video Object Planes (VOP), and Packets. A Video Object (VO) corresponds to an entity in the bitstream that the user can access and manipulate. The instance of a Video Object in given time is called Video Object Plane (VOP). A VO can consist of one or more layers (VOL). The GOV layer is an optional layer whose header indicates the absolute time, and that may be used for random access and error recovery purpose. In order to allow synchronization, the beginning of each part of the bitstream is indicated by the relevant start code. Start codes are unique words, recognizable from any legal sequence of variable length coded words. In the following, H1 indicates the start code for the VO, H2 the start code for the VOL, H3 the start code for the GOV, H4 the start code for the VOP, and H5 the packet start code (resync marker). If errors occur, start codes emulation is possible, as well as a missed detection.

In order to increase error robustness of MPEG-4 video, some error resilience tools have been made available in the MPEG-4 standard (see the article of Talluri). In particular, in order to make resynchronization easier and to reduce data loss, the MPEG-4 bitstream may be separated in packets, whose dimension may be chosen according to the application conditions. Information contained in a packet may then be separated in different partitions (data partitioning tool), allowing at least the utilization of the first partition data if the second is affected by errors. Reversible Variable Length Codes may also be used in order to aid the localization of errors and to reduce the amount of discarded data. Finally, Header Extension Codes allow the repetition of VOP header information in single packets, allowing recovering VOP header information if lost. Regardless of such tools, MPEG-4 video transmission over noisy channels is still critical.

According to an embodiment of the invention, concealment is performed at source decoding level, when errors are detected, in order to allow the reconstruction of the video sequence with an acceptable quality. Error detection is crucial for MPEG-4 video transmission in order to perform error concealment instead of using erroneous data: both the quality of the current VOP and of predicted (subsequent) VOP's take advantage of a good detection technique as erroneous data may propagate through VOP's decreasing the quality of the received video sequence. Furthermore the commonly used MPEG-4 decoders fail in their task if errors are not correctly detected. In particular, if GOV, VOP or packet header data are received with errors in some particular bits, these errors are not detected by the MPEG-4 decoder and decoding is carried out with wrong header information. It may result, for example, in a loss of the time reference or in a loss of synchronization causing the decoder fail in its task. Error detection based on data, as performed at MPEG-4 decoding level, does not guarantee error detection, in particular for header data. An additional technique providing error detection in header partitions is thus necessary in order to avoid the decoding process to be performed with erroneous data and to allow the MPEG-4 decoder to carry out its task.

The solution according to an embodiment comprises performing error detection on header's data at channel level with the transparent technique described, without modifying the error detection strategy as far as data partitions are concerned. Error detection is thus jointly performed by the channel codec and by the source decoder. This means that data assisted error detection is still used for header partitions, in order to recognize the easily detectable erroneous sequences substituted to the original ones, but it is used jointly with the transparent technique described. Information about the source is exploited to choose the detection technique suited to each partition.

The technique proposed is described below for the case of GOV header error detection and for VOP/packet header error detection.

Figure 3:
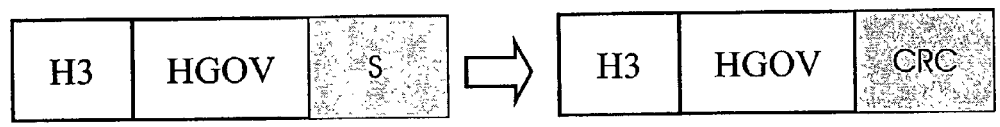
FIG. 3 shows the inclusion of an error detection code in a Group of Video Object Planes according to an embodiment of the invention.
Figure 4:
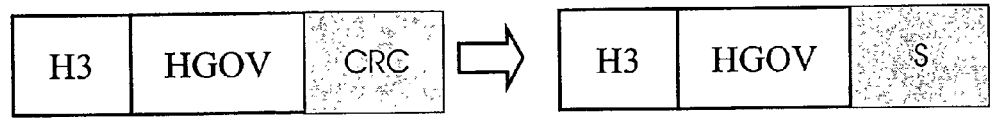
FIG. 4 shows the replacement of the error detection code in a Group of Video Object Planes by the original stuffing bits according to an embodiment of the invention.

FIG. 3 shows the inclusion of an error detection code in a Group of Video Planes according to an embodiment of the invention. As described above, a GOV is a Group of Video Object Planes whose header contains important time information. It is thus important to correctly receive a GOV header or, at least, to detect errors still present after channel decoding. A proper strategy may be applied consequently. A GOV header is a fixed length field (20 bits) always followed by four stuffing bits for byte integrity. Those stuffing bits are only used at source decoder level to have a confirmation of the presence of a start code and consist in a fixed sequence (a 0 followed by three 1's). As it is not necessary to transmit stuffing bits (these are in fixed number and consists of a known sequence), it is possible to exploit these four bits to transmit GOV header parity check bits. At the receiver, after channel decoding CRC check is performed. If errors are detected, another erroneous sequence is substituted to the GOV header, chosen among those easily detectable as such. The original stuffing bits are then substituted to CRC bits (see FIG. 4) and the resulting bitstream is fed to the MPEG-4 decoder. Compatibility with the standard is thus preserved. Furthermore, no extra redundancy is introduced in this embodiment, due to the exploitation of stuffing bits.

Figure 5:
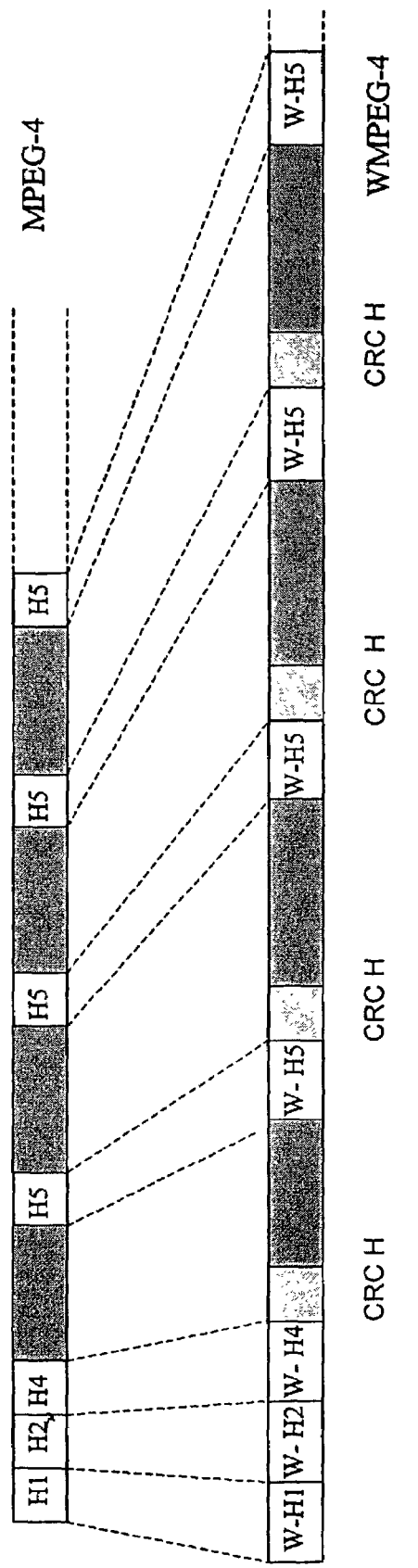
FIG. 5 shows Video Object Plane/Packet header CRC insertion in a Proportional Unequal Error Protection (P-UEP) scheme according to an embodiment of the invention.

FIG. 5 shows the inclusion of an error detection code in a VOP/packet header according to an embodiment of the invention. In the case of VOP/packet headers it is not possible to exploit stuffing bits, as these are not in a fixed number. An extra redundancy should thus be added to the bitstream. In this embodiment, header's CRC bits are inserted after the relevant start code. The lengths of the respective partitions of the packet are determined by a percentage of the packet length as proposed in the European patent application 00202531.0. CRC bits are preferably placed in this embodiment before the header H, as header's length is not fixed and not exactly known. The data partition, which includes the header, is taken as a fixed percentage of the packet length. Therefore, the length to consider for performing the CRC check is determined on the basis of a percentage of the packet length. The CRC check may thus be performed for a portion of bitstream which is not necessarily exactly coincident with the header. Preferably, start codes in the MPEG-4 source coded signal are substituted with wireless start codes WH1 . . . WH5 as proposed in European patent application 00202530.2 in order to obtain a signal WMPEG-4, which is an MPEG-4 signal suitable for wireless transmission.

Figure 6:
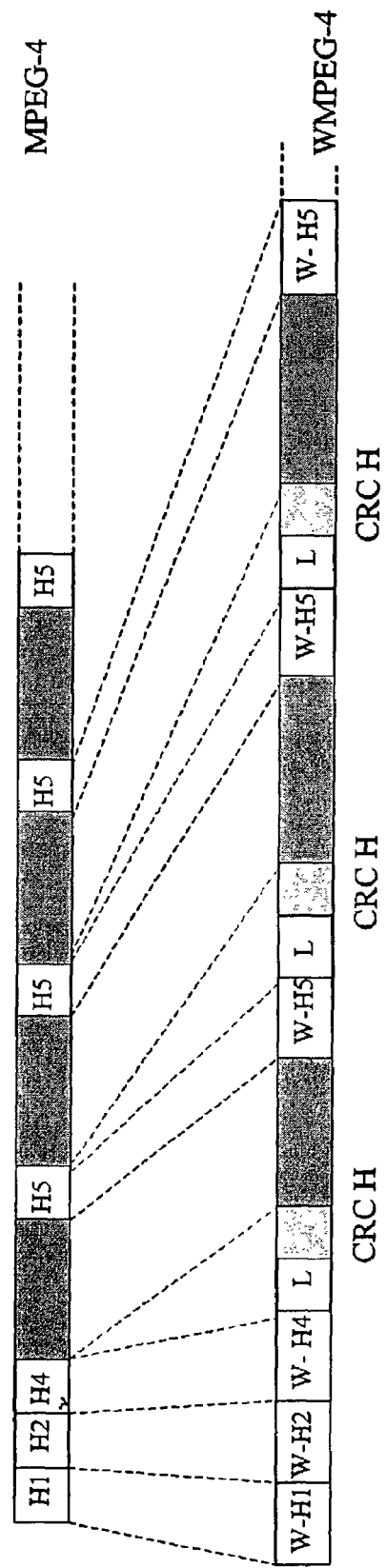
FIG. 6 shows Video Object Plane/Packet header CRC insertion in a length field assisted scheme according to a further embodiment of the invention.

FIG. 6 shows VOP/Packet header CRC insertion in a length field assisted scheme according to a further embodiment of the invention. The length field is an alternative for the proportional lengths. The length field is also proposed in European patent application 00202530.2. The lengths of the packet partitions are read from a length field L opportunely inserted in the bitstream.

Figure 7:
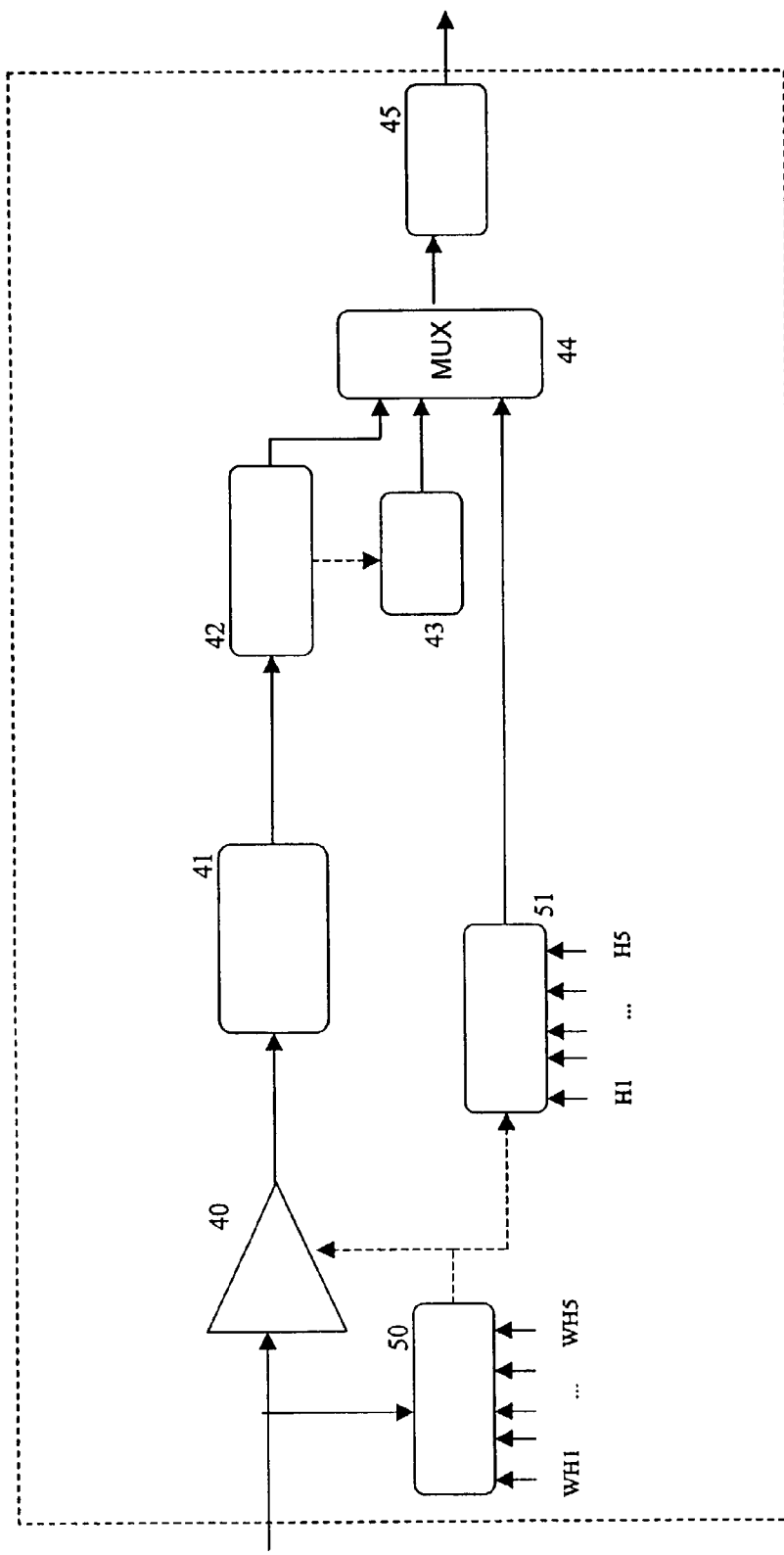
FIG. 7 shows a receiver according to an embodiment of the invention.

FIG. 7 shows a receiver according to an embodiment of the invention, which provides transparent detection in the case of P-UEP decoding with start codes detection and substitution according to a further embodiment of the invention. The receiver 4 thereto comprises a start code detection circuit 50, which compares the incoming signal with the wireless start codes. If a start code is detected, this detection is signaled to the packet buffer 40 and a start code substitution unit 51. The start code substitution unit generates the original start code corresponding to the detected wireless start code and provides the original start code to the multiplexer 44. The multiplexer includes the original start code in the output bitstream at a location corresponding to the location of the detected wireless start code. The percentages determining the lengths of the partitions are stored in the decoder. After channel decoding, CRC is evaluated. If the check reveals that errors have occurred, the header is substituted with a sequence of bits easily detectable as incorrect. CRC bits are then deleted from the bitstream to be fed to the MPEG-4 decoder. The MPEG-4 decoder may then perform error concealment of the packet. CRC bits insertion is thus completely standard compatible, as the MPEG-4 decoder does not need to be modified in order to read CRC bits and perform the CRC check, as these operation are performed before, in a transparent fashion. As an example of sequence easily detectable as incorrect, the substitution of the first part of the header with the all 0's sequence is considered: the first group of bit in the packet header represents the Macroblock number (Mbnum). It indicates the ordinal number of the first macroblock coded in the packet; it is thus a progressive number. If the implementation of the decoder considered performs error detection based on the progression of Mbnum's, inserting the all 0's sequence causes the MPEG-4 decoder to detect an error (unless we consider the first packet of a VOP) and to launch concealment. A similar effect may be obtained substituting the sequence corresponding to the Mbnum with an all 1's sequence. The Mbnum is a variable length code with length between 1 and 14 bits. The actual length of the code depends on the total number of macroblocks in the VOP; in the case of VOP's coincident with frames, the length only depends on the sequence format, and it is thus fixed for a fixed sequence format. The code is simply a binary representation of the macroblock number. As for the number of bits to set to 0 (or 1), it should thus be evaluated according to the format of the sequence.

With the proposed technique a very limited amount of data is discarded in case of error: channel based error detection is only performed for the parts of the bitstream where data assisted error detection is not sufficient to guarantee the detection (e.g. MPEG-4 headers); in these cases a single (MPEG-4) packet is concealed. If no errors occur in these portions, data assisted error detection is performed and only macroblocks containing errors are thus concealed; this means that only a small amount of data in the proximity of incorrect data is discarded in the packet. This is allowed by the joint source-channel approach considered.

Only errors in the header partition (or in general in the most critical partition from the detection point of view) cause the concealment of a whole (MPEG-4) packet (but only one). As explained above, if errors occur in data partitions, in our case it is the (MPEG-4) decoder to take care of error detection, thus performing error concealment at Macroblock level, discarding only a small amount of data in the packet.

Figure 8:
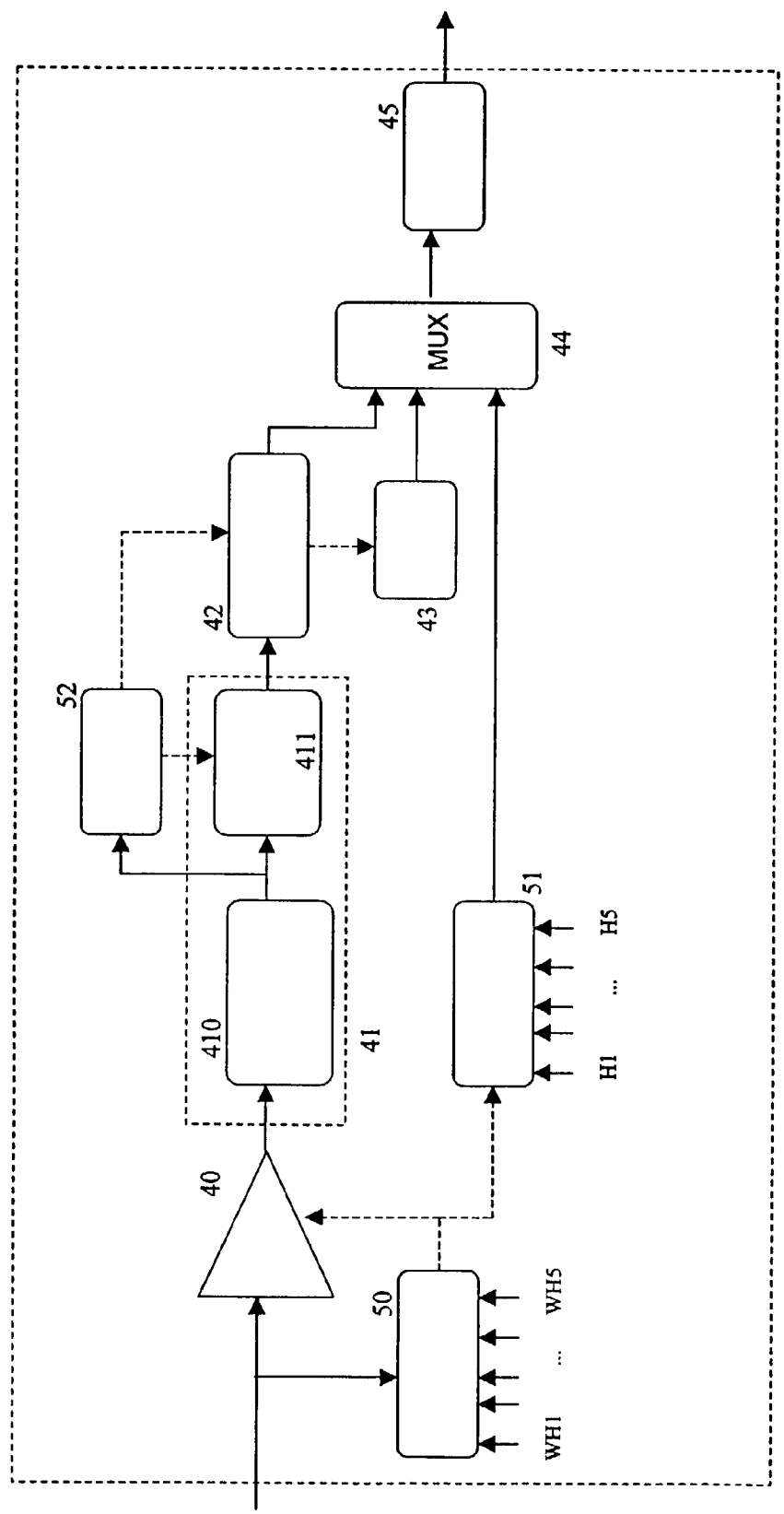
FIG. 8 shows a receiver according to a further embodiment of the invention.

FIG. 8 shows a receiver according to a further embodiment of the invention, which provides transparent detection in the case of length field assisted UEP with RCPC codes, with start codes detection and substitution. This embodiment is similar to the receiver of FIG. 7. In addition, the receiver of FIG. 8 is arranged to detect a length field included in the coded signal. Hereto the receiver 4 comprises a length field detector 52. The channel decoder is subdivided in a channel decoder 410 which channel decodes the incoming signal at a mother code rate. From the resulting channel decoded signal, the length field is read. Based on the length fields, the lengths of the partitions are determined, which lengths are used to further channel decode the signal by depuncturing in the depuncturing unit 411. The lengths are also furnished to the CRC check unit 42.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

The invention claimed is:

1. A coding method comprising the steps of:
   furnishing a source coded signal; and
   selectively adding respective error detection codes to respective source coded signal parts depending on the type of source coded signal part, the furnished source coded signal comprising source coded packets, the selective adding comprising evaluating an error detection code, of said respective error detection codes, on the header of a packet of said packets so that the evaluated code constitutes a representation of said header for use in a syntax error detection process in a decoder.

2. A method as claimed in claim 1, wherein important source coded signal parts are provided with respective error detection codes, whereas less important source coded parts are not provided with error detection codes.

3. A coding method comprising the steps of:
   furnishing a source coded signal; and
   selectively adding respective error detection codes to respective source coded signal parts depending on the type of source coded signal part for use in a syntax error detection process in a decoder,
   wherein the source coded signal comprises source coded packets,
   wherein a given error detection code is related to a part of given source coded packet,
   wherein the given error detection code is associated with a header of the given packet, and
   wherein the given error detection code is placed just in front of the header.

4. A coding method comprising the steps of: furnishing a source coded signal, and selectively adding respective error detection codes to respective source coded signal parts depending on the type of source coded signal part for use in a syntax error detection process in a decoder, wherein the step of adding comprises replacing a portion of the source coded signal by at least part of the error detection code.

5. A method as claimed in claim 4, wherein the source coded signal comprises stuffing bits, and wherein the error detection codes are added to the source coded signal by replacing the stuffing bits.

6. An encoder comprising: means for furnishing a source coded signal, and means for selectively adding respective error detection codes to respective source coded signal parts depending on the type of source coded signal part for use in a syntax error detection process in a decoder, the furnished source coded signal comprising source coded packets, the selective adding comprising evaluating an error detection code, of said respective error detection codes, on the header of a packet of said packets so that the evaluated code constitutes a representation of said header.

7. A method of decoding a source coded signal including error detection codes, the respective error detection codes being related to respective selected source coded signal parts depending on the type of source coded signal part, the method comprising: checking the error detection codes to determine if the source coded signal includes an error, deleting the error detection codes, and in the case the source coded signal includes an error, substituting at least part of the source coded signal with a replacement word to indicate a source decoder that an error has occurred, said replacement word comprising a syntax-violating word for forcing the decoder to transparently detect error.

8. A decoder for decoding a source coded signal including error detection codes, the respective error detection codes being related to respective selected source coded signal parts depending on the type of source coded signal part, the decoder comprising: means for checking the error detection codes to determine if the source coded signal includes an error, means for deleting the error detection codes, and means for substituting at least part of the source coded signal with a replacement word to indicate a source decoder that an error has occurred in the case the source coded signal includes an error, said replacement word comprising a syntax-violating word for forcing the decoder to transparently detect error.

9. A receiver comprising a decoder as claimed in claim 8, the receiver further comprising a reproduction unit for reproducing the decoded source coded signal.

10. A source coded signal, embodied within a computer-readable medium, said signal being accompanied by error detection codes related to respective selected parts of said source coded signal for use in a syntax error detection process in a decoder, the selecting depending on the type of source coded signal part, the source coded signal comprising source coded packets, an error detection code, of said respective error detection codes, having been evaluated on the header of a packet of said packets so that the evaluated code constitutes a representation of said header.

11. A storage medium on which a source coded signal as claimed in claim 10 has been stored.

* * * * *